(12) United States Patent
Babich et al.

(10) Patent No.: US 8,895,352 B2
(45) Date of Patent: Nov. 25, 2014

(54) METHOD TO IMPROVE NUCLEATION OF MATERIALS ON GRAPHENE AND CARBON NANOTUBES

(75) Inventors: Katherina Babich, Yorktown Heights, NY (US); Alessandro Callegari, Yorktown Heights, NY (US); Zhihong Chen, Yorktown Heights, NY (US); Edward Kiewra, Hopewell Junction, NY (US); Yanning Sun, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 113 days.

(21) Appl. No.: 12/476,676

(22) Filed: Jun. 2, 2009

(65) Prior Publication Data
US 2010/0301336 A1 Dec. 2, 2010

(51) Int. Cl.
*H01L 51/40* (2006.01)
*H01L 21/02* (2006.01)
*H01L 29/66* (2006.01)
*H01L 29/786* (2006.01)

(52) U.S. Cl.
CPC .... *H01L 21/02532* (2013.01); *H01L 21/02664* (2013.01); *H01L 29/66742* (2013.01); *H01L 29/78687* (2013.01); *H01L 29/78684* (2013.01); *H01L 21/0262* (2013.01); *H01L 21/02376* (2013.01)
USPC .............................................. 438/99; 438/149

(58) Field of Classification Search
USPC ............................. 438/149, 962, 99, 151, 154
See application file for complete search history.

(56) References Cited

U.S. PATENT DOCUMENTS

| | | | |
|---|---|---|---|
| 5,472,787 A * | 12/1995 | Johnson et al. ............... | 428/448 |
| 6,204,156 B1 | 3/2001 | Ping | |
| 6,383,899 B1 * | 5/2002 | Voutsas ......................... | 438/486 |
| 6,620,719 B1 * | 9/2003 | Andry et al. .................. | 438/597 |
| 6,891,227 B2 | 5/2005 | Appenzeller et al. | |
| 7,344,928 B2 * | 3/2008 | Wong et al. ................... | 438/151 |
| 7,348,675 B2 | 3/2008 | Dubin et al. | |
| 7,534,628 B2 * | 5/2009 | Takai et al. ........................ | 438/5 |
| 7,576,398 B2 * | 8/2009 | Weimer ......................... | 257/411 |
| 2003/0219972 A1 * | 11/2003 | Green et al. ................... | 438/623 |
| 2004/0261455 A1 * | 12/2004 | Igari et al. .......................... | 65/24 |

(Continued)

OTHER PUBLICATIONS

Copel, M. "Structure and stability of ultrathin zirconium oxide layers on Si(001)" Jan. 24, 2000 Appl. Phys. Lett. 76 (4) p. 436-438.*

(Continued)

*Primary Examiner* — Fernando L Toledo
*Assistant Examiner* — Bryan Junge
(74) *Attorney, Agent, or Firm* — Vazken Alexanian; Michael J. Chang, LLC

(57) ABSTRACT

Techniques for forming a thin coating of a material on a carbon-based material are provided. In one aspect, a method for forming a thin coating on a surface of a carbon-based material is provided. The method includes the following steps. An ultra thin silicon nucleation layer is deposited to a thickness of from about two angstroms to about 10 angstroms on at least a portion of the surface of the carbon-based material to facilitate nucleation of the coating on the surface of the carbon-based material. The thin coating is deposited to a thickness of from about two angstroms to about 100 angstroms over the ultra thin silicon layer to form the thin coating on the surface of the carbon-based material.

20 Claims, 11 Drawing Sheets

(56) References Cited

U.S. PATENT DOCUMENTS

| | | | |
|---|---|---|---|
| 2005/0242342 A1* | 11/2005 | Suh et al. | 257/40 |
| 2006/0180859 A1* | 8/2006 | Radosavljevic et al. | 257/347 |
| 2007/0122621 A1* | 5/2007 | Kreupl et al. | 428/408 |
| 2008/0012461 A1* | 1/2008 | Yaniv et al. | 313/309 |
| 2009/0140801 A1* | 6/2009 | Ozyilmaz et al. | 327/581 |
| 2010/0316852 A1* | 12/2010 | Condo et al. | 428/201 |

OTHER PUBLICATIONS

Maeng, W. J. et al., 'Atomic scale nitrogen depth profile control during plasma enhanced atomic layer deposition of high k dielectrics,' 2007 Appl. Phys. Let. vol. 91 Iss. 9 p. 092901.*

Kedzierski, J. et al., 'Epitaxial graphene transistors on SiC substrates,' 2008 IEEE Transactions on Electron Devices vol. 55 No. 8 pp. 2078-2085.*

K.S. Novoselov et al., "Electric Field Effect in Atomically Thin Carbon Films," Science, vol. 306, pp. 666-669 (2004).

C. Berger et al., "Electronic Confinement and Coherence in Patterned Epitaxial Graphene," Science, vol. 312, pp. 1191-1196 (2006).

C. Berger et al., "Ultrathin Epitaxial Graphite: 2D Electron Gas Properties and a Route Toward Graphene-based Nanoelectronics," J. Phys. Chem., vol. 108, No. 52, pp. 19912-19916 (2004).

J.P. deSouza et al., "Inversion Mode n-Channel GaAs Field Effect Transistor With High-k/Metal Gate," Applied Physics Letters, 92, 153508 (2008).

A. Callegari et al., "Properties of SiO2/Si/GaAs Structures Formed by Solid Phase Epitaxy of Amorphous Silicon on GaAs," Applied Physics Letters, 58, 2540 (1991).

Y.M. Lin et al., "Operation of Graphene Transistors at Gigahertz Frequencies," Nano letters, vol. 9, No. 1, pp. 422-426 (2009).

X. Wang et al., "Atomic Layer Deposition of Metal Oxides on Pristine and Functionalized Graphene," J. Am. Chem. Soc., 130, pp. 8152-8153 (2008).

Y. Xuan et al., "Atomic-Layer-Deposited Nanostructures for Graphene-based Nanoelectronics," Applied Physics Letters, 92, 013101 (2008).

* cited by examiner

300

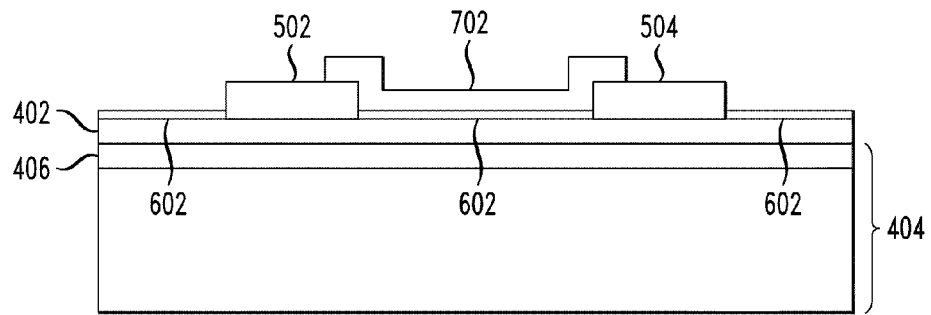
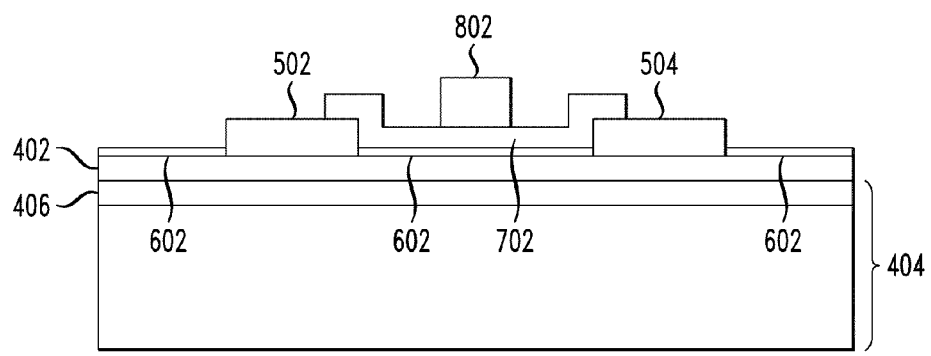
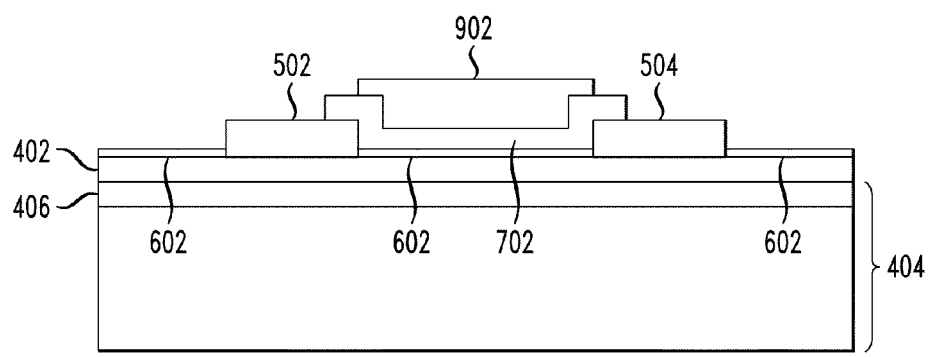

1000

1100

1300

1400

1500

1600

1700

1800

1900

US 8,895,352 B2

METHOD TO IMPROVE NUCLEATION OF MATERIALS ON GRAPHENE AND CARBON NANOTUBES

STATEMENT OF GOVERNMENT RIGHTS

This invention was made with Government support under Contract number FA8650-08-C-7838 awarded by (DARPA) Defense Advanced Research Projects Agency. The Government has certain rights in this invention.

FIELD OF THE INVENTION

The present invention relates to carbon-based materials, and more particularly, to techniques for forming a thin coating of a material, such as a high-k dielectric, on a carbon-based material, such as graphene.

BACKGROUND OF THE INVENTION

Graphene, a one carbon atom thick material, has a very high carrier mobility, making it suitable for use in high speed, high performance electronic devices. Current trends towards feature size scaling generally involve use of a high-k dielectric in these scaled graphene-based devices.

However, nucleation of high-k dielectrics on carbon-based materials such as graphene is problematic since bonding of the dielectric occurs by electrostatic forces. Specifically, carbon-based materials with honeycomb crystalline structures like graphene are chemically inert. The inertness makes it almost impossible to uniformly coat a thin layer of any material onto the carbon surface. Deposited material will only form clumps or clusters on the carbon surface rather than a uniform coating. While a uniform coating can eventually be achieved by adding more of the material, depositing enough material to gain complete coverage results in a layer that is too thick for some applications. This is the case with thin materials such as high-k dielectrics.

A conventional solution to this problem is to use nitrogen dioxide functionality to facilitate the bonding by exposing the carbon-based material to nitrogen dioxide gas prior to high-k dielectric deposition. This technique, however, shows degraded device performance due to low electron mobility. Namely, it has been suggested that a dipole forms at the interface of the dielectric and the carbon-based material, degrading device performance.

Therefore, techniques that improve nucleation of a thin coating of materials, such as high-k dielectrics, on carbon-based materials, such as graphene, without degrading device performance would be desirable.

SUMMARY OF THE INVENTION

The present invention provides techniques for forming a thin coating of a material on a carbon-based material. In one aspect of the invention, a method for forming a thin coating on a surface of a carbon-based material is provided. The method includes the following steps. An ultra thin silicon nucleation layer is deposited to a thickness of from about two angstroms to about 10 angstroms on at least a portion of the surface of the carbon-based material to facilitate nucleation of the coating on the surface of the carbon-based material. The thin coating is deposited to a thickness of from about two angstroms to about 100 angstroms over the ultra thin silicon layer to form the thin coating on the surface of the carbon-based material.

In another aspect of the invention, a method of fabricating a field-effect transistor (FET) device is provided. The method includes the following steps. A substrate is provided. A carbon-based material is formed on the substrate. Source and drain region electrodes are formed on a surface of the carbon-based material, spaced apart from one another so as to permit a gate electrode to be formed therebetween. An ultra thin silicon nucleation layer is deposited to a thickness of from about two angstroms to about 10 angstroms on at least a portion of the surface of the carbon-based material to facilitate nucleation of a dielectric layer on the surface of the carbon-based material. The dielectric layer is deposited over the ultra thin silicon layer. The gate electrode is formed over the dielectric layer between the source and drain region electrodes.

In yet another aspect of the invention, a FET device is provided. The FET device includes a substrate; a carbon-based material on the substrate; source and drain region electrodes on a surface of the carbon-based material, spaced apart from one another so as to permit a gate electrode to be placed therebetween; an ultra thin silicon nucleation layer having a thickness of from about two angstroms to about 10 angstroms on at least a portion of the surface of the carbon-based material to facilitate nucleation of a dielectric layer on the surface of the carbon-based material; the dielectric layer over the ultra thin silicon layer; and the gate electrode over the dielectric layer between the source and drain region electrodes.

A more complete understanding of the present invention, as well as further features and advantages of the present invention, will be obtained by reference to the following detailed description and drawings.

BRIEF DESCRIPTION OF THE DRAWINGS

FIGS. 4-9 are diagrams illustrating an exemplary methodology for fabricating a field-effect transistor (FET) device according to an embodiment of the present invention;

DETAILED DESCRIPTION OF PREFERRED EMBODIMENTS

Figure 1:
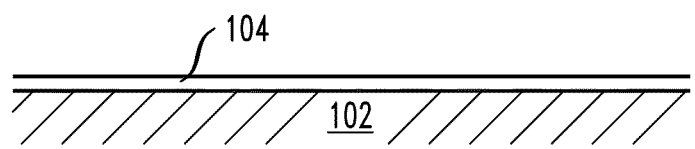
FIGS. 1 and 2 are cross-sectional diagrams illustrating an exemplary methodology for forming a thin coating on a surface of a carbon-based material according to an embodiment of the present invention.
Figure 2:
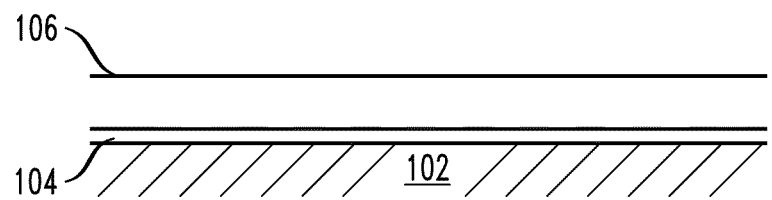

The present teachings address the above-described problems associated with thin coating chemically inert carbon-based materials. Examples of carbon-based materials as they are described herein include, but are not limited to, graphene, carbon nanotubes and carbon fibers. Advantageously, it has been determined by way of the present teachings that an ultra thin silicon nucleation layer on the surface of the carbon-based material can facilitate nucleation of the coating to achieve complete coverage of the surface, without affecting the electrical properties of the carbon-based material. By way of example only, FIGS. 1 and 2 are cross-sectional diagrams illustrating an exemplary methodology for forming a thin coating on a surface of a carbon-based material. As shown in FIG. 1, an ultra thin silicon nucleation layer 104 is deposited on a surface of carbon-based material 102. Silicon layer 104 may or may not be a continuous layer, i.e., silicon layer 104 does not have to fully cover the surface of carbon-based material 102 to serve as a nucleation center for the thin coating.

According to an exemplary embodiment, silicon layer 104 comprises amorphous silicon. As highlighted above, the purpose of silicon layer 104 is to facilitate nucleation of the thin coating on carbon-based material 102. However, silicon layer 104 should be thin enough so as not to affect the electrical characteristics of the carbon-based material. For example, depositing silicon layer 104 to a thickness of from about two angstroms (Å) to about 10 Å, e.g., from about three Å to about eight Å, will serve to facilitate nucleation of the thin coating but will not affect the electrical characteristics of the carbon-based material.

Silicon layer 104 can be deposited on the surface of carbon-based material 102 by a variety of methods. According to one exemplary embodiment, silicon layer 104 is deposited on the surface of carbon-based material 102 in a vacuum chamber using low pressure (e.g., about 20 milliTorr (mTorr)), low power (e.g., low power radio frequency (RF) plasma at about 30 milliwatts per square centimeter ($mW/cm^2$)) plasma-enhanced chemical vapor deposition (PECVD) in the presence of a gas mixture containing two percent (%) silane diluted in helium, for a duration of about three minutes. The substrate is heated to a temperature T of, e.g., about 350 degrees Celsius (° C.) and is grounded during the deposition.

The use of a low pressure, low power PECVD process serves to minimize plasma damage. Such a process has been proven to produce very low interface states ($D_{it}$) on both silicon and gallium arsenide substrates. Alternatively, a less intrusive (no plasma) technique may be used to deposit silicon layer 104 on carbon-based material 102. For example, according to another exemplary embodiment, silicon layer 104 is deposited using molecular beam epitaxy (MBE) or rapid thermal chemical vapor deposition (RTCVD) (for example, at a temperature of from about 450° C. to about 900° C. with silane and/or dichlorosilane as the silicon source).

Depending on the particular application, it may be desirable to create a neutral charge state in silicon layer 104. For instance, an example will be presented in detail below wherein the carbon-based material serves as the body of a transistor device and the silicon layer is used to facilitate coating a thin gate dielectric, e.g., a high-k dielectric, on the surface of the carbon-based material. In such a device, performance can be degraded due to low electron mobility at the interface of the dielectric and the surface of the carbon-based material. To this point, conventional processes use a nitrogen dioxide monolayer to nucleate high-k dielectrics on carbon surfaces. However, interface trap charges have been observed at the high-k/carbon interface where the nitrogen dioxide layer is located. The dipole nature of nitrogen dioxide is suspected to be responsible for the trapped charges.

Advantageously, according to the present teachings, a neutral charge state can be created in silicon layer 104 to minimize, or eliminate, the problems associated with interface trap charges, e.g., by either oxidation or nitridation of silicon layer 104. This step is optional. By way of example only, exposing silicon layer 104 to an oxygen environment, such as to ambient air will, by way of oxidation, result in the formation of silicon dioxide a neutral charge molecule.

As shown in FIG. 2, a thin coating 106 is deposited over silicon layer 104, e.g., to a thickness of from about two Å to about 100 Å. The present teachings are generally applicable to forming any type of thin coating on the surface of a carbon-based material. By way of example only, the coating can comprise a nitride material, an oxide material, a metal or as highlighted above, a dielectric. According to one exemplary embodiment, the coating comprises a high-k dielectric, such as aluminum oxide.

Any suitable deposition process may be used to deposit thin coating 106 over silicon layer 104. According to an exemplary embodiment, thin coating 106 is deposited over silicon layer 104 using atomic layer deposition (ALD), for example, in 50 cycles at 250° C. The presence of silicon layer 104 facilitates nucleation of thin coating 106, permitting thin coating 106 to form a continuous layer over the surface of carbon-based material 102. Without silicon layer 104 as a nucleation center, forming a continuous layer of such a thin coating on the surface of carbon-based material 102 would not be possible. The above-described techniques for forming a carbon-based material/ultra thin silicon nucleation layer/thin coating material can be used to form a coating on a carbon-based material for a variety of different applications. See examples below.

Figure 3:
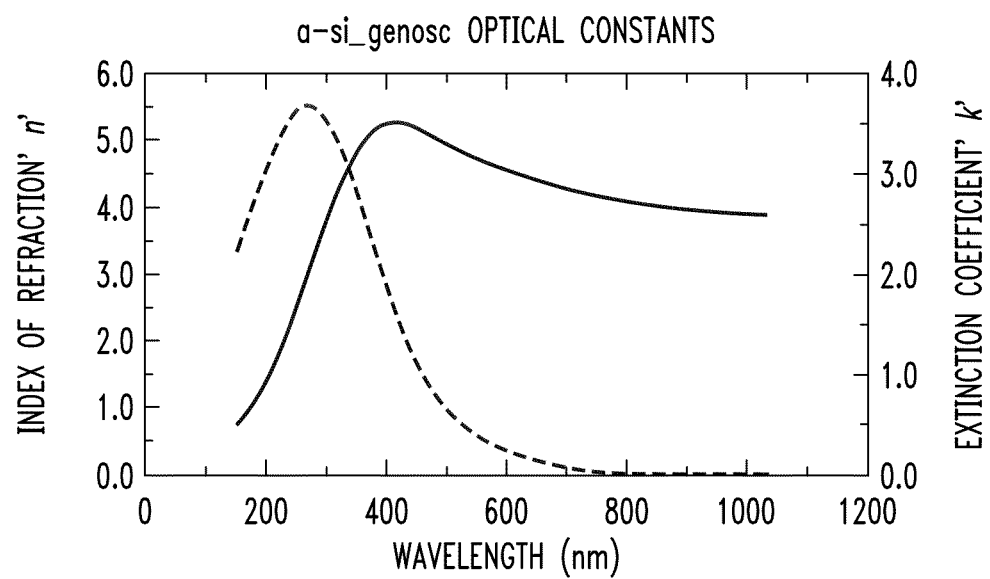
FIG. 3 is a graph illustrating index of refraction n and extinction coefficient k as a function of wavelength for ultra thin deposited amorphous silicon according to an embodiment of the present invention.

To illustrate the efficacy of the present techniques to produce an ultra thin silicon layer for high-k dielectric nucleation, an ultra thin amorphous silicon layer was deposited on a silicon dioxide layer according to the above-described process. Ellipsometric analysis of the sample was then conducted. The results of the analysis are shown in FIG. 3. Namely, FIG. 3 is a graph 300 illustrating index of refraction n and extinction coefficient k as a function of wavelength (measured in nanometers (nm)) for the deposited amorphous silicon (a-Si). The dotted line in graph 300 is extinction coefficient k, and the solid line is index of refraction n.

Figure 4:
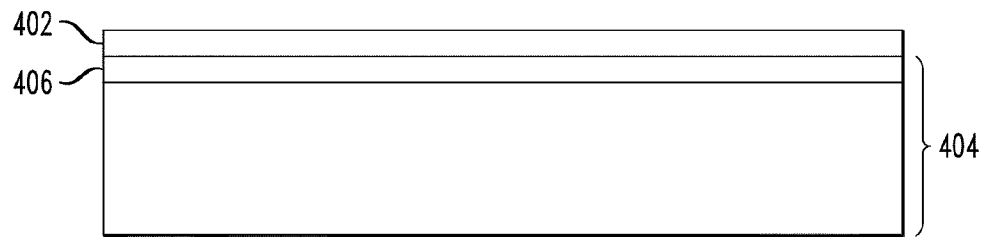

One exemplary implementation of the above-described process involves forming a thin coating of a dielectric on the carbon-based material of a field-effect transistor (FET) device. FIGS. 4-9 are diagrams illustrating an exemplary methodology for fabricating such a device. In general, a FET comprises a source region and a drain region connected by a channel, and a gate (separated from the channel by a gate dielectric) which regulates electron flow between the source and drain. As shown in FIG. 4, fabrication of the device begins with a carbon-based material 402 being formed (e.g., deposited or grown) on a provided substrate 404. According to an exemplary embodiment, the carbon-based material comprises graphene which is deposited on substrate 404 using a standard process, such as an exfoliation method as described in K. S. Novoselov et al., "Electric Field Effect in Atomically Thin Carbon Films," Science, vol. 306, pgs. 666-669 (2004), the contents of which are incorporated by reference herein. The carbon-based material can also be grown on substrate 404. Growth of a carbon-based material is described, for example, in C. Berger et al., "Electronic Confinement and Coherence in Patterned Epitaxial Graphene," Science, vol. 312, pgs. 1191-1196 (2006), and in C. Berger et al., "Ultrathin Epitaxial Graphite: 2D Electron Gas Properties and a Route Toward Graphene-based Nanoelectronics," J. Phys. Chem., vol. 108, no. 52, pgs. 19912-19916 (2004), the contents of both of which are incorporated by reference herein. Carbon-based material 402 effectively serves as the body or channel of the device.

Any suitable substrate can be used as substrate 404, including, but not limited to, a bulk silicon wafer. The substrate may, or may not serve as part of the device. For example, substrate 404 can be a doped silicon substrate that serves as a bottom/back gate of the device. In that instance, an insulating layer, e.g., a silicon dioxide layer 406, can be formed on substrate 404 (e.g., to a thickness of about 300 nm) prior to deposition of the carbon-based material. Standard techniques may be employed to form the silicon dioxide layer on the substrate. Carbon-based material 402 would then be formed on insulating layer 406. The insulating layer is however optional, and would not be necessary in cases where substrate 404 does not serve as part of the device.

Figure 11:
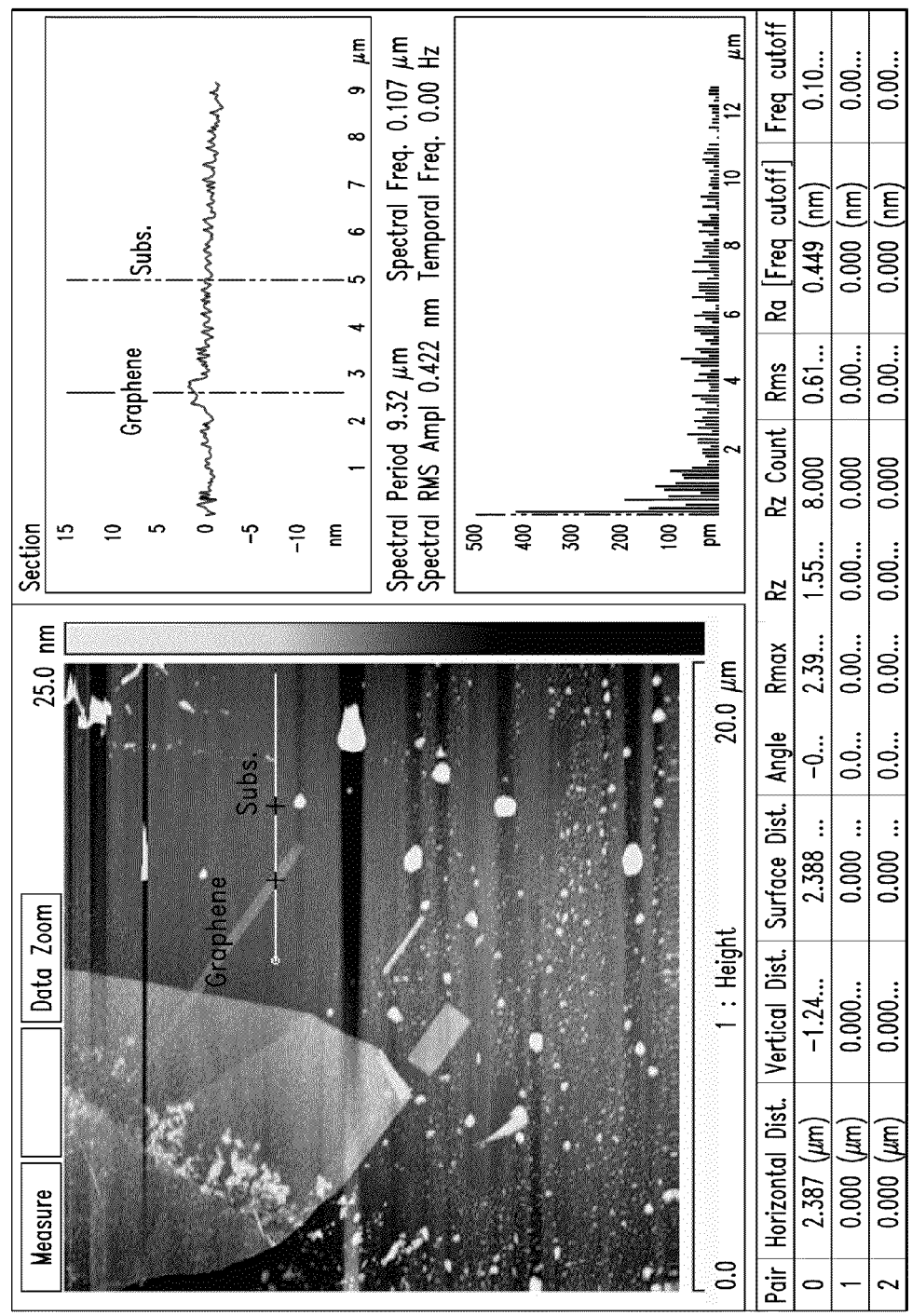
FIG. 11 is an atomic force microscope (AFM) image of the graphene flake of FIG. 10 according to an embodiment of the present invention.

At this point in the process, an analysis of the properties of the carbon-based material formed may optionally be performed. By way of example only, optical, atomic force microscope (AFM) and/or scanning electron microscope (SEM) analysis of carbon-based material 402 may be conducted, e.g., to determine the thickness of the carbon-based material sample. Such analysis techniques are known to those of skill in the art and thus are not described further herein. An AFM image of a graphene sample is shown in FIG. 11, described below.

Figure 5:
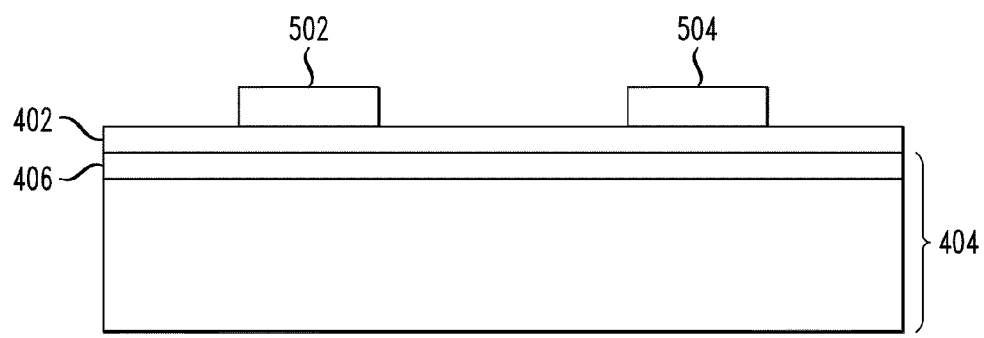

As shown in FIG. 5, source and drain region electrodes, i.e., metal contacts, 502 and 504 (the source and drain regions of the device) are formed on a surface of carbon-based material 402 opposite substrate 404. Exemplary techniques for forming source and drain region electrodes on a carbon-based material are presented below. As shown in FIG. 5, source and drain region electrodes 502 and 504 are spaced apart from one another so as to permit a gate electrode to be formed therebetween (see below).

Figure 14:
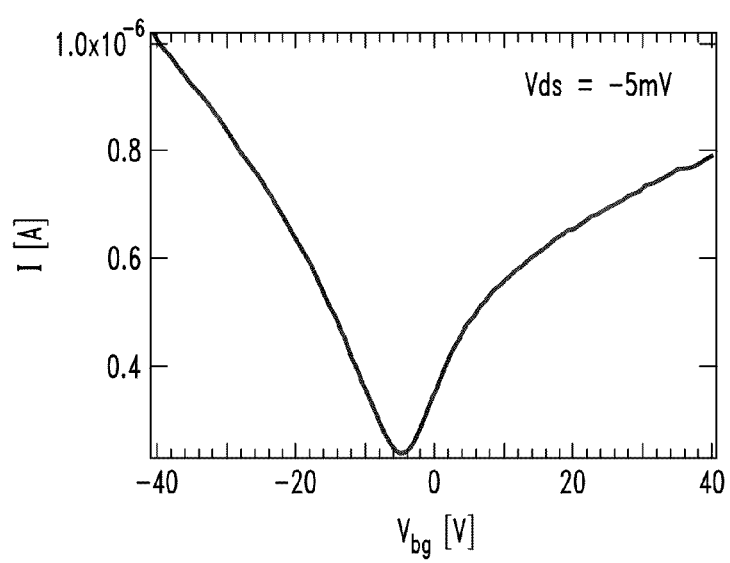
FIG. 14 is a graph illustrating current-voltage (I-V) characteristics of the device structure of FIGS. 12 and 13 using back gate measurements according to an embodiment of the present invention.

At this point in the process, electrical measurements (e.g., electrical characteristics and mobility) may optionally be performed to verify the quality of carbon-based material 402. Exemplary results of these electrical measurements performed on a sample are shown in FIG. 14, described below.

Figure 6:
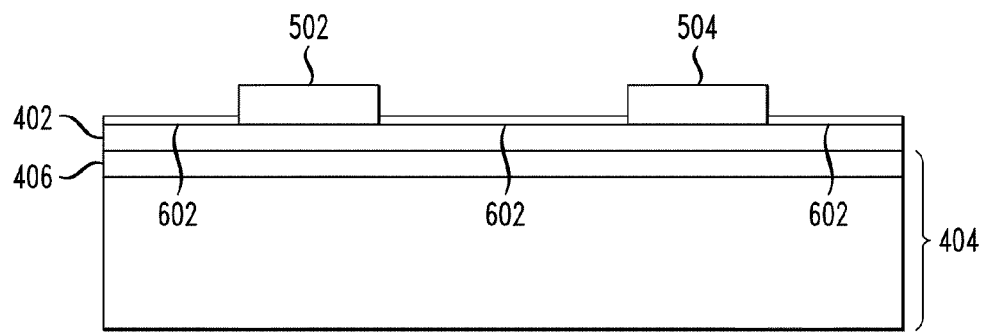

As shown in FIG. 6, an ultra thin silicon nucleation layer 602 is deposited over the surface of carbon-based material 402 to facilitate nucleation of a dielectric layer that will be deposited on the surface of carbon-based material 402. The use of an ultra thin silicon layer to facilitate nucleation of a thin coating on the surface of a carbon-based material, including the composition, thickness and methods for deposition of the ultra thin silicon nucleation layer were described in detail above. Further, as described above, silicon layer 602 may be a continuous or discontinuous layer.

In this example, it is desirable to create a neutral charge state in silicon layer 602, so as to avoid trap charges at the interface of the dielectric layer and the carbon-based material, as described above. A neutral charge state can be created in silicon layer 602 in several different ways. One way is to oxidize silicon layer 602 by exposing silicon layer 602 to an oxygen environment, such as to the ambient air, prior to depositing the dielectric layer (i.e., thus creating silicon dioxide a neutral charge molecule). If the dielectric layer includes an oxide, such as aluminum oxide, then another way to create a neutral charge state in silicon layer 602 is to deposit the oxide dielectric in-situ. Namely, as highlighted above, the silicon nucleation layer can be deposited in a vacuum chamber using low pressure, low power PECVD. The oxide dielectric can then be deposited without breaking the vacuum. The oxide dielectric deposition typically involves oxygen which will then oxidize silicon layer 602 (again forming silicon dioxide). If the dielectric layer includes a nitride, such as aluminum nitride, then yet another way to create a neutral charge state in silicon layer 602 is through nitridation, e.g., by depositing the nitride dielectric in-situ. Namely, the nitride dielectric deposition will convert the silicon in silicon layer 602 into silicon nitride a neutral charge molecule.

As shown in FIG. 7, a dielectric layer 702 is deposited over silicon layer 602. According to an exemplary embodiment, dielectric layer 702 comprises a high-k dielectric, such as aluminum oxide or aluminum nitride, and is deposited over silicon layer 602 using ALD (as described above) to a thickness of from about two Å to about 100 Å. In this example, dielectric layer 702 will serve as the gate dielectric. As shown in FIG. 7, dielectric layer 702 can be etched away locally in the source and drain regions to expose source and drain region electrodes 502 and 504.

Figure 16:
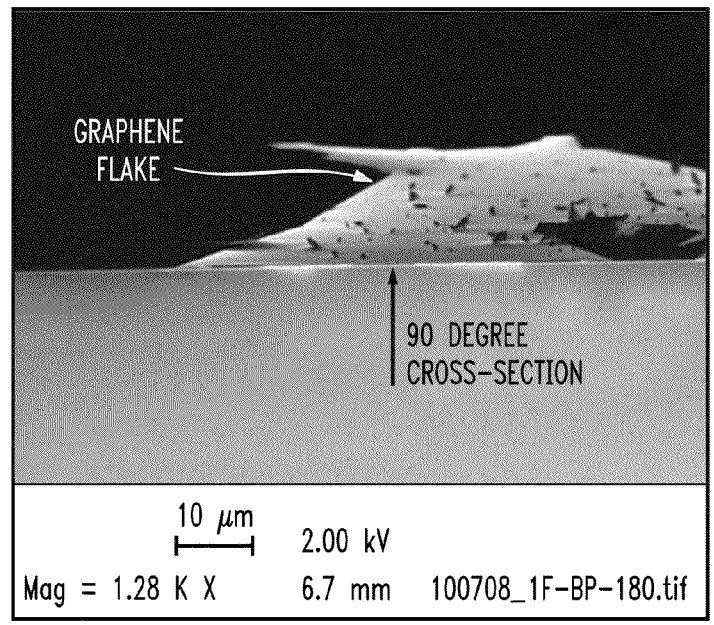
FIG. 16 is a tilted cross-sectional SEM image of a graphene flake post amorphous silicon/high-k dielectric deposition according to an embodiment of the present invention.
Figure 17:
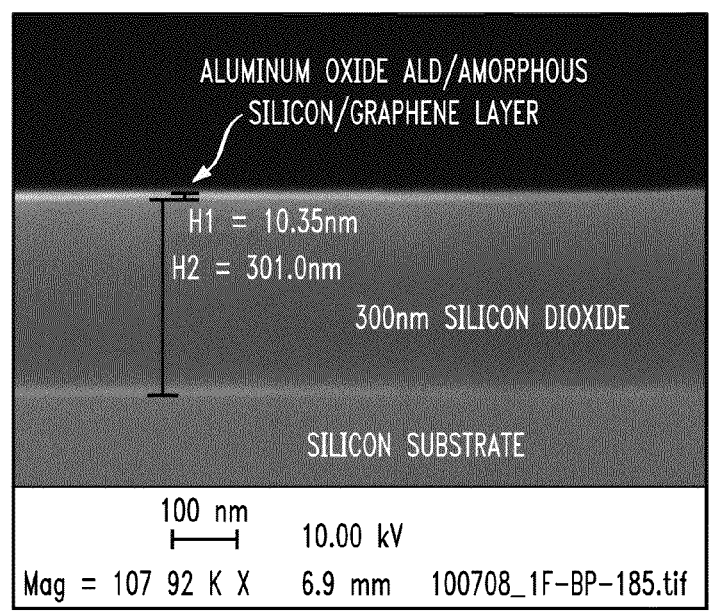
FIG. 17 is a 90 degree cross-sectional image of a graphene flake post amorphous silicon/high-k dielectric deposition according to an embodiment of the present invention.

At this point in the process, SEM analysis post dielectric deposition may optionally be conducted. Exemplary results of such an analysis conducted on a sample graphene-based device are shown in FIGS. 16 and 17, described below.

A gate electrode, i.e., metal contact, (the gate of the device) is then formed over dielectric layer 702 between source and drain region electrodes 502 and 504, and separated from carbon-based material 402 by dielectric layer 702 (and by silicon layer 602 which is however thin enough so as not to affect the electrical properties of the carbon-based material). The gate electrode formed can be either a partial gate electrode or a full gate electrode. For example, as shown in FIG. 8, a partial gate electrode 802 is formed over dielectric layer 702 between source and drain region electrodes 502 and 504. The same techniques used to form the source and drain region electrodes may be used to form a partial gate electrode. As shown in FIG. 9, a full gate electrode 902 is formed over dielectric layer 702 between source and drain region electrodes 502 and 504. The same techniques used to form the source and drain region electrodes may be used to form a full gate electrode.

Figure 10:
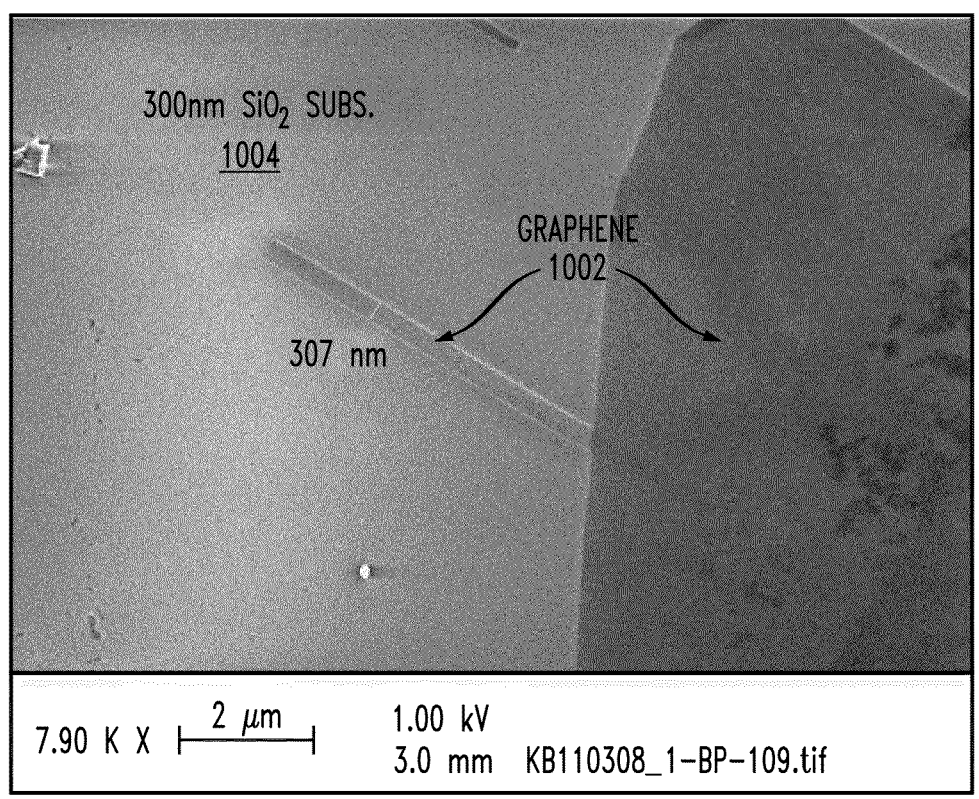
FIG. 10 is a top-down scanning electron micrograph (SEM) image depicting a graphene flake deposited on a substrate according to an embodiment of the present invention.

By way of reference to a non-limiting example, the above-described techniques are now used to form a specific type of FET device, i.e., a top and bottom gated FET device. FIG. 10 is a top-down SEM image 1000 depicting a graphene flake 1002 which was deposited on a substrate by an exfoliation method. The term "graphene flake" is a common nomenclature used to describe graphene areas prepared by an exfoliation method. Graphene flakes can consist of many different graphene structures. Thickness (number of layers) and shape of the graphene can vary significantly across the flake due to the preparation method. An area of a graphene flake which is suitable for device fabrication consists of one or two layer thick graphene material and is usually situated near the edge of the flake. In FIG. 10, the graphene flake 1002 includes both a long and thin graphene bar-like structure (to which the left arrow points) and a large and thick graphene area (to which the right arrow points) (i.e., both the long and thin graphene bar-like structure and the large and thick graphene area belong to the same graphene flake 1002). The long and thin graphene bar-like structure portion of the flake was chosen to fabricate the graphene device, as the large and thick graphene area is likely not suitable for device fabrication.

On the other hand, if a graphene layer is formed by an epitaxial growth method where graphene thickness and uniformity can be controlled, then the device can be fabricated anywhere on the layer. The term graphene flake is not used to describe a graphene layer prepared by an epitaxial growth technique.

In this example, the substrate (subs.) is a doped silicon substrate having a silicon dioxide ($SiO_2$) insulator layer 1004 (visible in image 1000) on which graphene flake 1002 is deposited. Through doping, the substrate is rendered conductive and thus serves as a bottom gate electrode (also referred to herein as a back gate) of the device. Silicon dioxide layer 1004 has a thickness of about 300 nm.

As highlighted above an analysis of the properties, such as thickness, of the carbon-based material formed may be performed. Accordingly, FIG. 11 is an AFM image 1100 of the graphene flake of FIG. 10. The thickness of the graphene flake was found to be from about two nm to about three nm by AMF analysis. This corresponds to from about one layer to about two layers of graphene taking into account the weak interaction between the silicon dioxide and the graphene.

Figure 12:
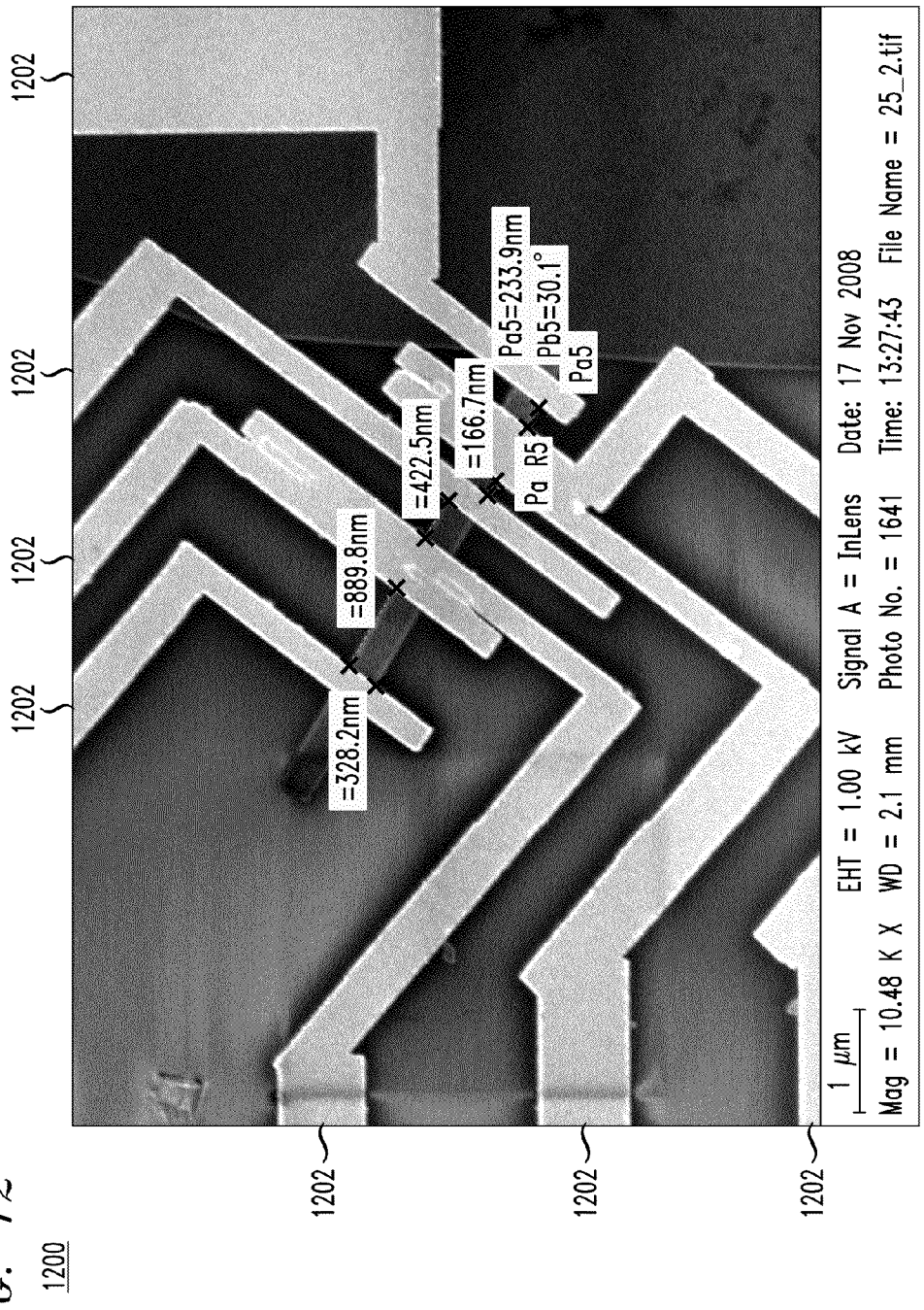
FIG. 12 is a top-down SEM image of source and drain region electrodes formed to the graphene flake of FIG. 10 according to an embodiment of the present invention.
Figure 13:
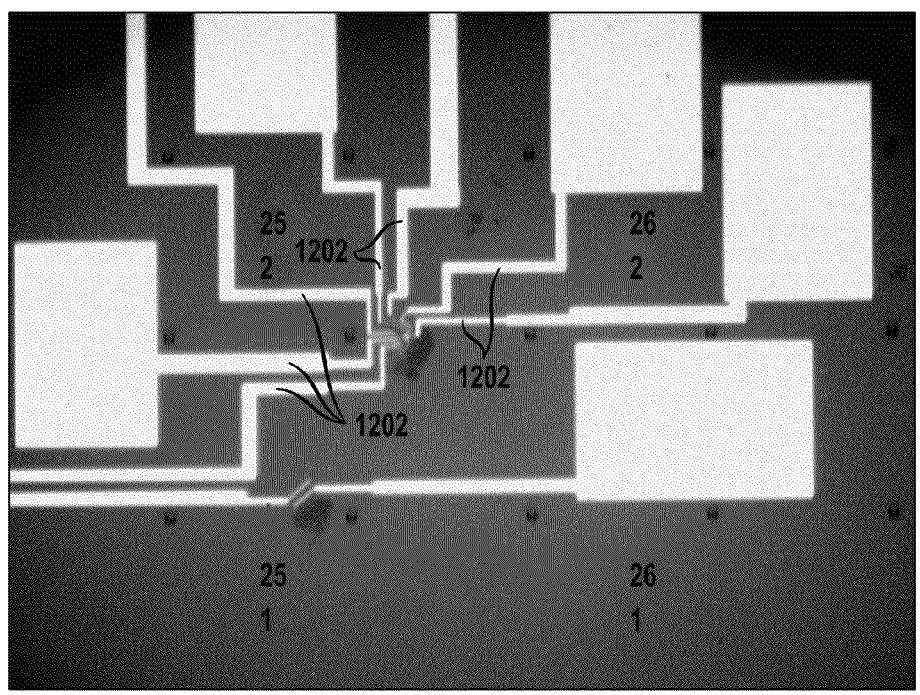
FIG. 13 is a top-down optical image of the source and drain region electrodes of FIG. 12 according to an embodiment of the present invention.

FIG. 12 is a top-down SEM image 1200 of source and drain region electrodes 1202 formed to the graphene flake of FIG. 10 (i.e., the graphene flake serves as a body/channel of the device). FIG. 13 is a top-down optical image 1300 of source and drain region electrodes 1202. In this example, source and drain region electrodes 1202 are formed using electron beam (e-beam) lithography with a poly(methyl methacrylate) (PMMA) resist process and contact metal (e.g., titanium/palladium/gold) evaporation. Specifically, a PMMA resist is deposited over the graphene flake and patterned using e-beam lithography with a shape and location of the source and drain region electrodes. E-beam lithography using a PMMA resist is known to those of skill in the art and thus is not described further herein.

Contact metals, e.g., a one nm thick layer of titanium, followed by a 40 nm thick layer of palladium, followed by a 20 nm thick layer of gold, are then deposited over the patterned resist using an evaporation process at room temperature. The parameters and steps for depositing these contact metals using an evaporation process are well known to those of skill in the art and thus are not described further herein. After contacts formation, the remaining PMMA resist is removed by a conventional lift-off process in an 80° C. acetone bath.

As highlighted above, electrical measurements (e.g., electrical characteristics and mobility) may be performed to verify the quality of the carbon-based material. Accordingly, FIG. 14 is a graph 1400 illustrating current-voltage (I-V) characteristics of the device structure of FIGS. 12 and 13 using back gate measurements (i.e., with the doped substrate acting as the bottom/back gate electrode). Namely, device current (i.e., the current passing through the graphene flake) as a function of the back gate voltage is measured to extract the mobility of the graphene channel. In graph 1400, back gate voltage $V_{bg}$ (measured in volts (V)) is plotted on the x-axis and current I (measured in amps (A)) is plotted on the y-axis. A source-drain voltage $V_{ds}$ of −5 millivolts (mV) was employed in the measurements. As shown in graph 1400, the device structure showed good electrical characteristics and mobility of about 1,357 square centimeter per volt second ($cm^2/Vs$).

Once the source and drain region electrodes have been formed, an ultra thin amorphous silicon nucleation layer and a high-k dielectric layer are deposited on the graphene flake according to the processes and parameters set forth in detail above. As presented above, the ultra thin amorphous silicon layer can be deposited in a vacuum chamber using low pressure, low power PECVD in the presence of a gas mixture containing two % silane diluted in helium. In this particular example, prior to amorphous silicon deposition, the vacuum chamber was pumped down to a pressure of about $1 \times 10^{-6}$ Torr using a turbo molecular pump. The amorphous silicon deposition was carried out at a power of seven watts (W) (30 mW/$cm^2$), $20 \times 10^{-3}$ Torr of pressure at a flow of 50 standard cubic centimeters per minute (sccm) for three minutes. Substrate temperature was about 350° C. This amorphous silicon deposition process was found to produce low interface states on gallium arsenide devices, significantly improving electrical characteristics. See, for example, J. P. deSouza et al., "Inversion Mode n-Channel GaAs Field Effect Transistor With High-k/Metal Gate," Applied Physics Letters, 92, 153508 (2008) and A. Callegari et al., "Properties of $SiO_2$/Si/GaAs Structures Formed by Solid Phase Epitaxy of Amorphous Silicon on GaAs," Applied Physics Letters, 58, 2540 (1991), the contents of both of which are incorporated by reference herein.

Figure 15:
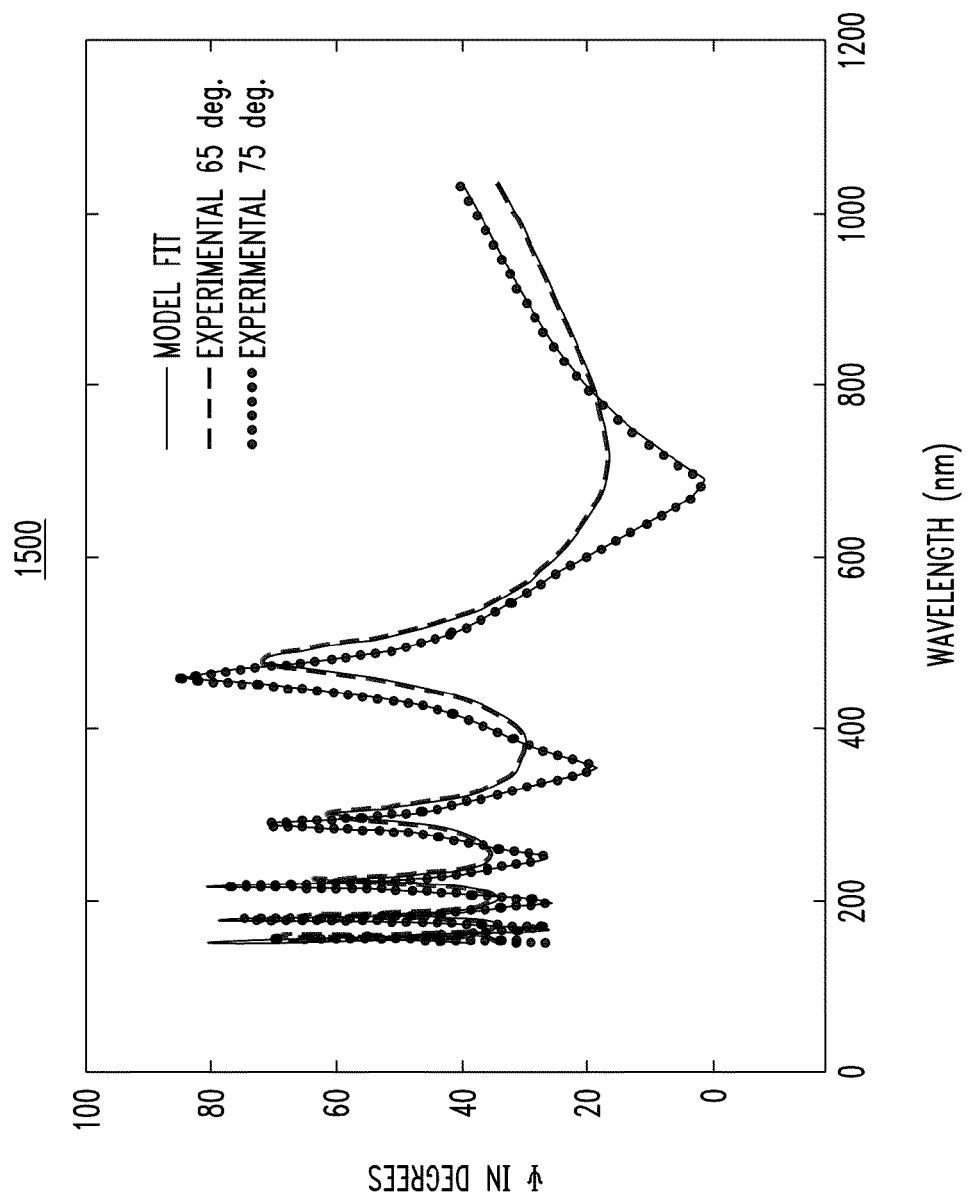
FIG. 15 is a graph illustrating experimental ellipsometric spectra of angle of polarization Ψ collected at 65 degrees and at 75 degrees according to an embodiment of the present invention.

Ellipsometric measurements were performed on a reference sample which included a silicon substrate, a silicon dioxide layer on the substrate and an amorphous silicon layer on the silicon dioxide layer. It was found that the amorphous silicon layer was about 0.3 nm thick. FIG. 15 is a graph 1500 illustrating experimental ellipsometric spectra of angle of polarization $\Psi$ collected at 65 degrees (dash line) and at 75 degrees (dotted line). In graph 1500, wavelength (measured in nm) is plotted on the x-axis and $\Psi$ in degrees is plotted on the y-axis. These experimental data were compared with the modeled data (solid line) to determine the amorphous silicon layer thickness, the index of refraction n and the extinction coefficient k. Index of refraction n and extinction coefficient k of an amorphous silicon layer as a function of wavelength is shown in FIG. 3, described above.

As highlighted above, SEM analysis post amorphous silicon/high-k dielectric deposition may also be conducted. FIG. 16 is a tilted cross-sectional SEM image 1600 of a graphene flake, such as the graphene flake of FIG. 10, post amorphous silicon/high-k dielectric deposition. A 90 degree cross-section of the flake in FIG. 16 which highlights the amorphous silicon/high-k dielectric is shown in FIG. 17. Namely, FIG. 17 is a 90 degree cross-sectional image 1700 of the graphene flake, such as the graphene flake of FIG. 10, post amorphous silicon/high-k dielectric deposition. Images 1600 and 1700 illustrate that the high-k dielectric and the ultra thin silicon layer are present over both the graphene flake and the silicon dioxide layer of the doped substrate.

Following deposition of the high-k dielectric layer, a gate electrode is then formed over the high-k dielectric layer between the source and drain region electrodes. In this particular example, the gate electrode presently formed is referred to herein as a top gate electrode, so as to differentiate it from the bottom/back gate (see above). More specifically, the top gate electrode is a metal gate defined by a lithographic process, whereas the doped silicon substrate serves as the bottom/back gate.

Figure 18:
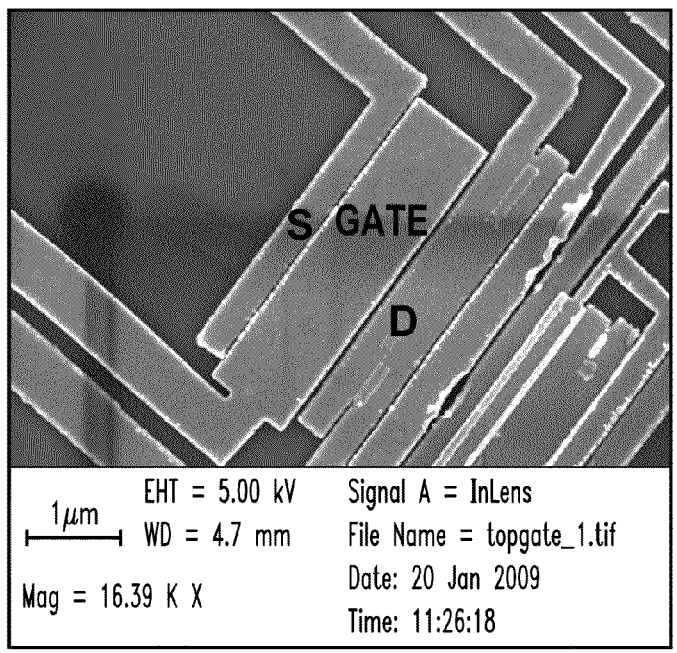
FIG. 18 is a top-down SEM image of a device structure post amorphous silicon/high-k dielectric deposition and post top gate electrode formation according to an embodiment of the present invention.

FIG. 18 is a top-down SEM image 1800 of the device structure (e.g., of FIG. 12) post amorphous silicon/high-k dielectric deposition and post top gate electrode formation. In image 1800, the source and drain region electrodes are labeled "S" and "D," respectively, and the top gate electrode is labeled "Gate." The gate electrode is formed using the procedures, described above, that were used to form the source and drain region electrodes. Namely, the top gate electrode is formed using e-beam lithography with a PMMA resist process and contact metal (e.g., titanium/palladium/gold) evaporation.

Figure 19:
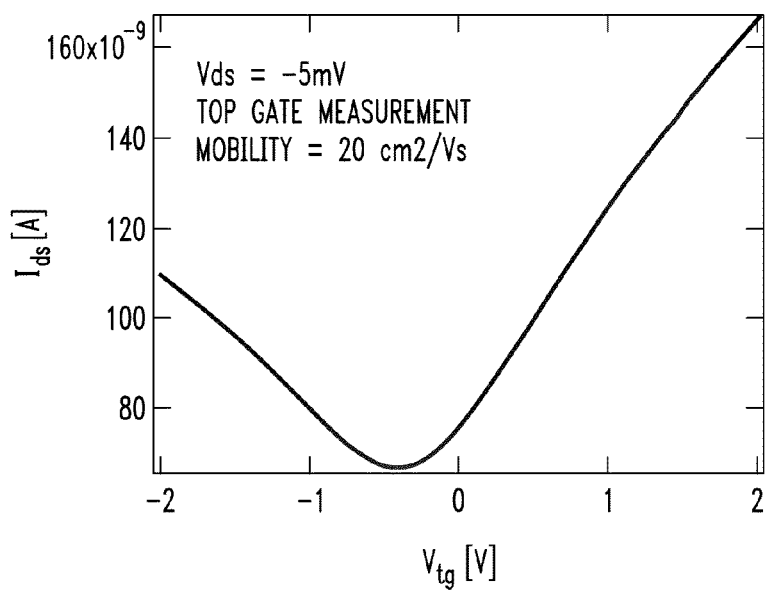
FIG. 19 is a graph illustrating current versus top gate voltage for the device structure of FIG. 18 according to an embodiment of the present invention.

Following top gate electrode formation, electrical measurements (e.g., electrical characteristics and mobility) were again performed to verify the quality of the carbon-based material. FIG. 19 is a graph 1900 illustrating current versus top gate voltage for the device structure of FIG. 18. In graph 1900, top gate voltage $V_{tg}$ (measured in V) is plotted on the x-axis and source-drain current $I_{ds}$ (measured in A) is plotted on the y-axis. A source-drain voltage $V_{ds}$ of −5 mV was employed in the measurements. Device mobility after top gate formation is about 20 $cm^2/Vs$. Mobility degradation is likely to be reduced with adjustments of the silicon layer and ALD deposition conditions.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method for forming a thin coating on a surface of a carbon-based material, comprising the steps of:
   depositing an ultra thin silicon nucleation layer to a thickness of from about two angstroms to about 10 angstroms on at least a portion of an exposed area of the surface of the carbon-based material to facilitate nucleation of the coating on the surface of the carbon-based material yet leaving electrical characteristics of the carbon-based material unaffected by the ultra thin silicon nucleation layer, wherein the ultra thin silicon nucleation layer comprises amorphous silicon and wherein the carbon-based material comprises a graphene flake or a portion thereof having from about one to about two layers of graphene;
   creating a neutral charge state in the ultra thin silicon nucleation layer; and
   depositing the thin coating to a thickness of from about two angstroms to about 100 angstroms over the ultra thin silicon nucleation layer to form the thin coating which is continuous on the surface of the carbon-based material, wherein the neutral charge state is created in the ultra thin silicon nucleation layer by depositing the coating over the ultra thin silicon nucleation layer in situ and thereby converting the ultra thin silicon nucleation layer into a neutral charge molecule, wherein the ultra thin silicon nucleation layer, as deposited, forms a non-continuous layer directly on the exposed area of the surface of the carbon-based material and wherein the non-continuous layer facilitates nucleation of the thin coating that is continuous on the surface of the carbon-based material.

2. The method of claim 1, wherein the coating comprises a dielectric layer.

3. The method of claim 2, wherein the coating comprises a high-k dielectric layer.

4. The method of claim 1, wherein the coating is deposited over the ultra thin silicon nucleation layer using atomic layer deposition.

5. The method of claim 1, wherein the ultra thin silicon nucleation layer is deposited to a thickness of from about three angstroms to about eight angstroms on the at least a portion of the surface of the carbon-based material.

6. The method of claim 1, wherein the ultra thin silicon nucleation layer is deposited on the at least a portion of the surface of the carbon-based material using plasma-enhanced chemical vapor deposition in a vacuum chamber using a low pressure of about 20 millitorr and a low radio frequency plasma at about 30 milliwatts per square centimeter so as to minimize plasma damage.

7. The method of claim 1, wherein the ultra thin silicon nucleation layer is deposited on the at least a portion of the surface of the carbon-based material using rapid thermal chemical vapor deposition at a temperature of from about 450° C. to about 900° C. with dichlorosilane as a silicon source.

8. The method of claim 1, further comprising the step of:
   oxidizing the ultra thin silicon nucleation layer before depositing the thin coating.

9. The method of claim 1, wherein the coating includes an oxide, and wherein the neutral charge state created in the ultra thin silicon nucleation layer by depositing the coating in situ results in conversion of the ultra thin silicon nucleation layer to silicon dioxide.

10. The method of claim 1, wherein the coating includes a nitride, and wherein the neutral charge state created in the ultra thin silicon nucleation layer by depositing the coating in situ results in conversion of the ultra thin silicon nucleation layer to silicon nitride by nitridation.

11. The method of claim 1, wherein the ultra thin silicon nucleation layer is deposited using a plasma-free process to prevent plasma damage.

12. The method of claim 1, further comprising the step of:
   patterning the thin coating.

13. A method of fabricating a field-effect transistor (FET) device comprising the steps of:
   providing a substrate;
   forming a carbon-based material on the substrate, wherein the carbon-based material comprises graphene;
   forming source and drain region electrodes on a surface of the carbon-based material using electron beam lithography with a poly(methyl methacrylate (PMMA) resist process and contact metal evaporation, wherein the source and drain region electrodes are spaced apart from one another so as to permit a gate electrode to be formed therebetween;
   depositing an ultra thin silicon nucleation layer to a thickness of from about two angstroms to about 10 angstroms on at least a portion of an exposed area of the surface of the carbon-based material to facilitate nucleation of a dielectric layer on the surface of the carbon-based material yet leaving electrical characteristics of the carbon-based material unaffected by the ultra thin silicon nucleation layer, wherein the ultra thin silicon nucleation layer is present only on the surface of the carbon-based material, and comprises amorphous silicon;
   creating a neutral charge state in the ultra thin silicon nucleation layer;
   depositing the dielectric layer over the ultra thin silicon nucleation layer as a continuous layer on the surface of the carbon-based material and covering at least a portion of the source and drain region electrodes having a thickness of from about two angstroms to about 100 angstroms, wherein the neutral charge state is created in the ultra thin silicon nucleation layer by depositing the dielectric layer over the ultra thin silicon nucleation layer in situ, wherein the ultra thin silicon nucleation layer, as deposited, forms a non-continuous layer directly on the exposed area of the surface of the carbon-based material and wherein the non-continuous layer facilitates nucleation of the dielectric that is continuous on the surface of the carbon-based material;

removing portions of the dielectric layer to expose the source and drain region electrodes; and after the source and drain region electrodes have been exposed, forming the gate electrode over the dielectric layer between the source and drain region electrodes.

14. The method of claim 13, wherein the dielectric layer comprises a high-k dielectric layer.

15. The method of claim 13, wherein the ultra thin silicon nucleation layer is deposited to a thickness of from about three angstroms to about eight angstroms on the at least a portion of the surface of the carbon-based material.

16. The method of claim 13, wherein the step of forming the carbon-based material on the substrate further comprising the step of:

depositing or growing the carbon-based material on the substrate.

17. The method of claim 13, wherein the substrate comprises an insulator layer, the method further comprising the step of:

forming the carbon-based material on the insulator layer.

18. The method of claim 13, further comprising the step of:

analyzing the carbon-based material using atomic force microscope (AFM) analysis to determine a thickness thereof.

19. The method of claim 13, wherein the substrate comprises a doped silicon substrate that serves as a back gate of the FET device, the method further comprising the steps of:

forming an insulating layer on the substrate to a thickness of about 300 nanometers; and forming the carbon-based material on the insulating layer.

20. The method of claim 13, wherein the gate electrode extends fully a distance between the source and drain region electrodes, but is in a non-overlapping position relative to the source and drain region electrodes.

* * * * *